(12) United States Patent
Johnson et al.

(10) Patent No.: US 6,297,957 B1
(45) Date of Patent: Oct. 2, 2001

(54) APPARATUS FOR REDUCING ELECTROMAGNETIC EMISSIONS FROM A COMPUTER

(75) Inventors: Robert W. Johnson, Pflugerville; Richard L. Eddings, II, Austin; James D. Curlee, Round Rock; Andrew L. McAnally, Georgetown, all of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/467,417

(22) Filed: Dec. 20, 1999

(51) Int. Cl.$^7$ ...................................................... G06F 1/20
(52) U.S. Cl. ........................ 361/687; 361/816; 439/607
(58) Field of Search ................................... 361/687, 730, 361/736, 752, 753, 777, 788, 796, 797, 799, 816, 818, 784, 785; 439/607–609; 174/35 R

(56) References Cited

U.S. PATENT DOCUMENTS

| | | | |
|---|---|---|---|
| 4,872,212 | 10/1989 | Roos et al. | 361/424 |
| 4,903,170 | 2/1990 | Finney et al. | 361/424 |
| 5,323,299 | 6/1994 | Weber | 361/818 |
| 5,386,346 | 1/1995 | Gleadall | 361/799 |
| 5,406,453 | 4/1995 | Cusato et al. | 361/733 |
| 5,519,585 | 5/1996 | Jones et al. | 361/818 |
| 5,731,633 | 3/1998 | Clayton | 257/723 |
| 6,011,688 * | 1/2000 | Thornburg et al. | 361/695 |
| 6,055,152 * | 4/2000 | Felcman et al. | 361/683 |
| 6,205,020 * | 3/2001 | Felcman et al. | 361/683 |

\* cited by examiner

Primary Examiner—Gerald Tolin
Assistant Examiner—Hung Van Duong
(74) Attorney, Agent, or Firm—Haynes and Boone, L.L.P.

(57) ABSTRACT

An apparatus including a base substrate including a reference voltage plane. A plurality of spaced apart printed circuit substrates are attached to the base substrate. Each one of the printed circuit substrates includes a reference voltage plane attached to the reference voltage plane of the base substrate. A system component is removably attached to a first side of at least one of the printed circuit substrates. The system component is electrically connected to the reference voltage plane of the printed circuit substrate. A support member is attached to a second side of each printed circuit substrate. Each support member is electrically coupled to the reference voltage plane of the printed circuit substrate. The support members are electrically connected to a reference voltage plane of the printed circuit substrate to provide a low impedance return current path for the electrical portion of the electromagnetic emissions, thereby reducing the magnitude of electromagnetic emissions.

30 Claims, 10 Drawing Sheets

APPARATUS FOR REDUCING ELECTROMAGNETIC EMISSIONS FROM A COMPUTER

BACKGROUND

The disclosures herein relate generally to computers and more particularly to an apparatus for reducing electromagnetic emissions from a computer.

The operating frequencies of system components in electronic devices such as computers are continually increasing. As the operating frequency increases, the wavelength of electromagnetic emissions from the system component decreases. The reduced wavelength enables electromagnetic emissions to escape through discontinuities that are too small to be breached by emissions having a larger wavelength. As a result, the performance of many previous apparatus and methods for controlling electromagnetic emissions in an electronic device are rendered inadequate in electronic devices having system components running at relatively high operating speeds.

RAMBUS In-Line Memory Modules, also referred to as RIMM modules, illustrate one example of high performance system components that operate at a relatively high operating speed. The performance of RIMM modules is attained through a high-speed bus enabling clock speeds in excess of 400 MHz. Through the use of one or more riser cards, RIMM modules may be configured to provide memory in excess of 8 GigaBytes.

A riser card is connected to a memory connector on a motherboard of the computer and a plurality of RIMM modules are connected to the riser card through corresponding RIMM connectors that are mounted on the riser card. In this configuration, the RIMM modules are in elevated, parallel relationship with respect to the motherboard. The quantity of RIMM modules and their orientation above the motherboard in open space results in increased electromagnetic emissions and complicates the task of containing these emissions within the computer.

When designing a computer system using RIMM modules, as well as other types of heat generating system components, it must be taken into consideration that the performance and operating life of these types of system components are adversely affected by excessive temperatures. The magnitude of memory attainable with RIMM modules and the frequency at which RIMM modules operate can result in the generation of tremendous quantities of heat. As a result, it is necessary to use a apparatus to control the operating temperature of these types of heat generating system components.

U.S. Pat. No. 5,731,633 discloses a semiconductor module such as a memory module. The semiconductor module includes a composite substrate comprising a printed circuit substrate with a thin metal cover laminated to a first side of the printed circuit substrate. A plurality of semiconductor devices such as memory chips are mounted to a second side of the printed circuit substrate. The semiconductor module is configured to be mated with a connector mounted on a main printed circuit board in a computer such as a motherboard, or with a connector mounted on an expansion card.

U.S. Pat. No. 5,519,585 discloses an electromagnetic emissions shield that is removably secured to a side of a printed circuit substrate. The shield includes a polymeric layer with a metallic conductive layer formed on the polymeric layer. The portion of the overall strength of a system component that is attributed to shielding is negligible and the inherent strength of the shield is minimal with regard to the total required strength of a system component. Furthermore, the shield does not substantially aid in mounting the system component to a corresponding electronic device.

U.S. Pat. No. 4,872,212 discloses an electronic device which includes a plurality of electromagnetically isolated modular units. The modular units are interchangeably and detachably mounted in an electromagnetic containment enclosure. The enclosure includes a plurality of sides and an open face. Each modular unit includes a shielding member and a system component mounted on the shielding member. Each shielding member includes an edge member. A plurality of modular units may be stacked in the enclosure such that the edge members form a segmented wall in the opening for limiting the escape of electromagnetic emissions from the opening.

Electromagnetic emissions become problematic when they encounter a non-shielded portion of an electronic device such as a gap between two panels of a metal chassis or an opening formed in a face of the chassis. Provided that the wavelength of the electromagnetic emission is smaller than a corresponding dimension of the unshielded portion of the electronic device, the emissions may breach the confines of the enclosure of the electronic device. These emissions may similarly breach and enter the enclosure of adjacent electronic equipment, potentially causing electromagnetic interference (EMI) with respect to the operation of the adjacent electronic equipment. To limit the potential for adverse operation of equipment resulting from EMI, regulation agencies such as the Federal Communications Commission (FCC) have imposed limits on the allowable levels of electromagnetic emissions emitted from many electronic devices, including computers.

Accordingly, there is a need for an apparatus that provides improved containment of electromagnetic emissions from system components running at relatively high operating frequencies in an electronic device while allowing the system components to be mounted for permitting enhanced cooling of the system components.

SUMMARY

One embodiment, accordingly, provides an apparatus for mounting system components in an enclosure of an electronic device and for controlling electromagnetic emissions associated with the system components. To this end, the apparatus includes a base substrate having a reference voltage plane. A plurality of spaced apart printed circuit substrates are attached to the base substrate. Each one of the printed circuit substrates includes a reference voltage plane attached to the reference voltage plane of the base substrate. A system component is removably attached to a first side of a first one of the printed circuit substrates. The system component is electrically connected to the reference voltage plane of the first printed circuit substrate. A support member is attached to a second side of the first printed circuit substrate. The support member is electrically coupled to the reference voltage plane of the first printed circuit substrate.

A principal advantage of this embodiment is that the support members are electrically connected to a reference voltage plane of the printed circuit substrate to provide a low impedance return current path for the electrical portion of the electromagnetic emissions, thereby reducing adverse affects of electromagnetic emissions.

BRIEF DESCRIPTION OF THE DRAWING FIGURES

DETAILED DESCRIPTION

Figure 1:
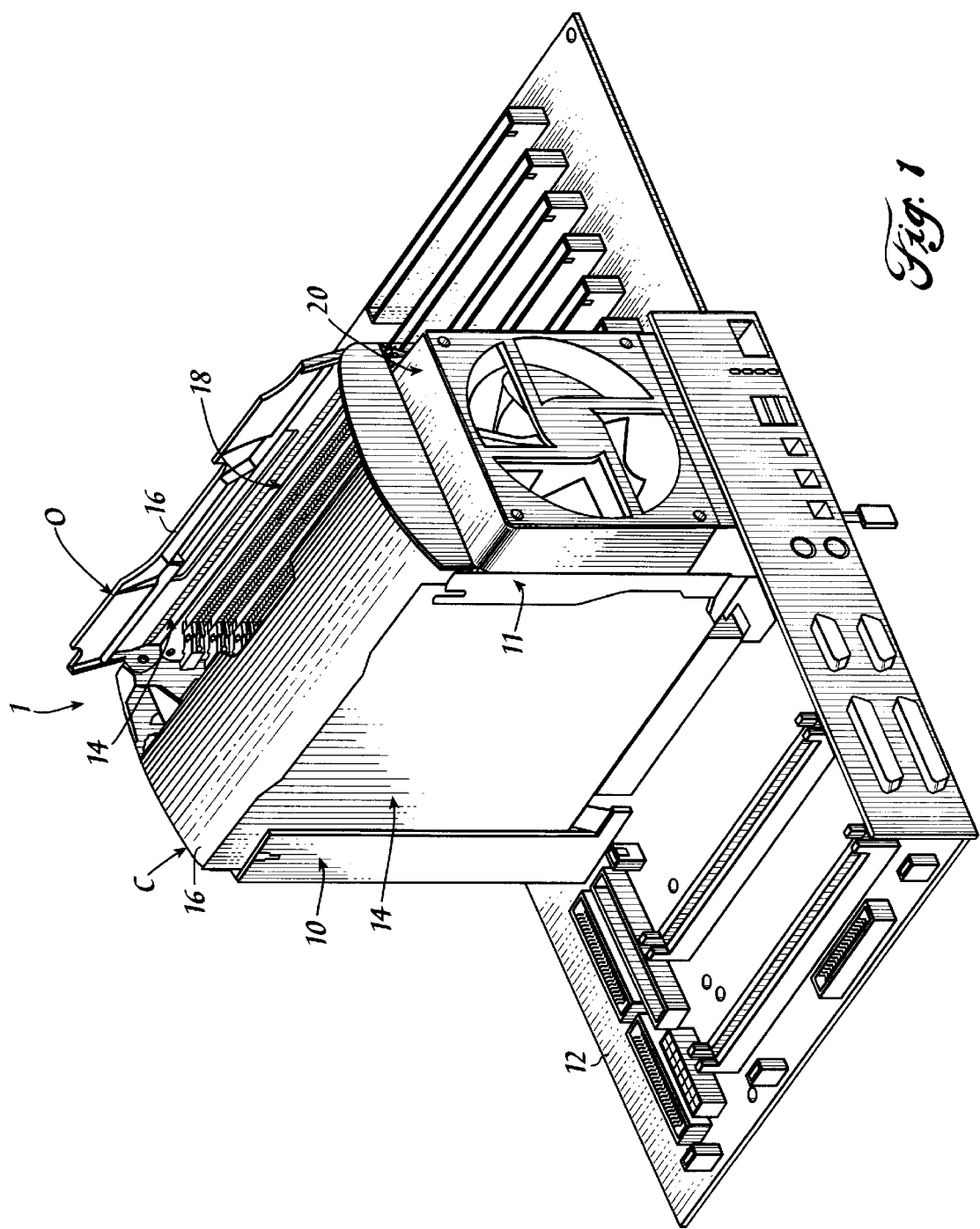
FIG. 1 is a perspective view illustrating an embodiment of an apparatus used for cooling according to the present disclosure.
Figure 2:
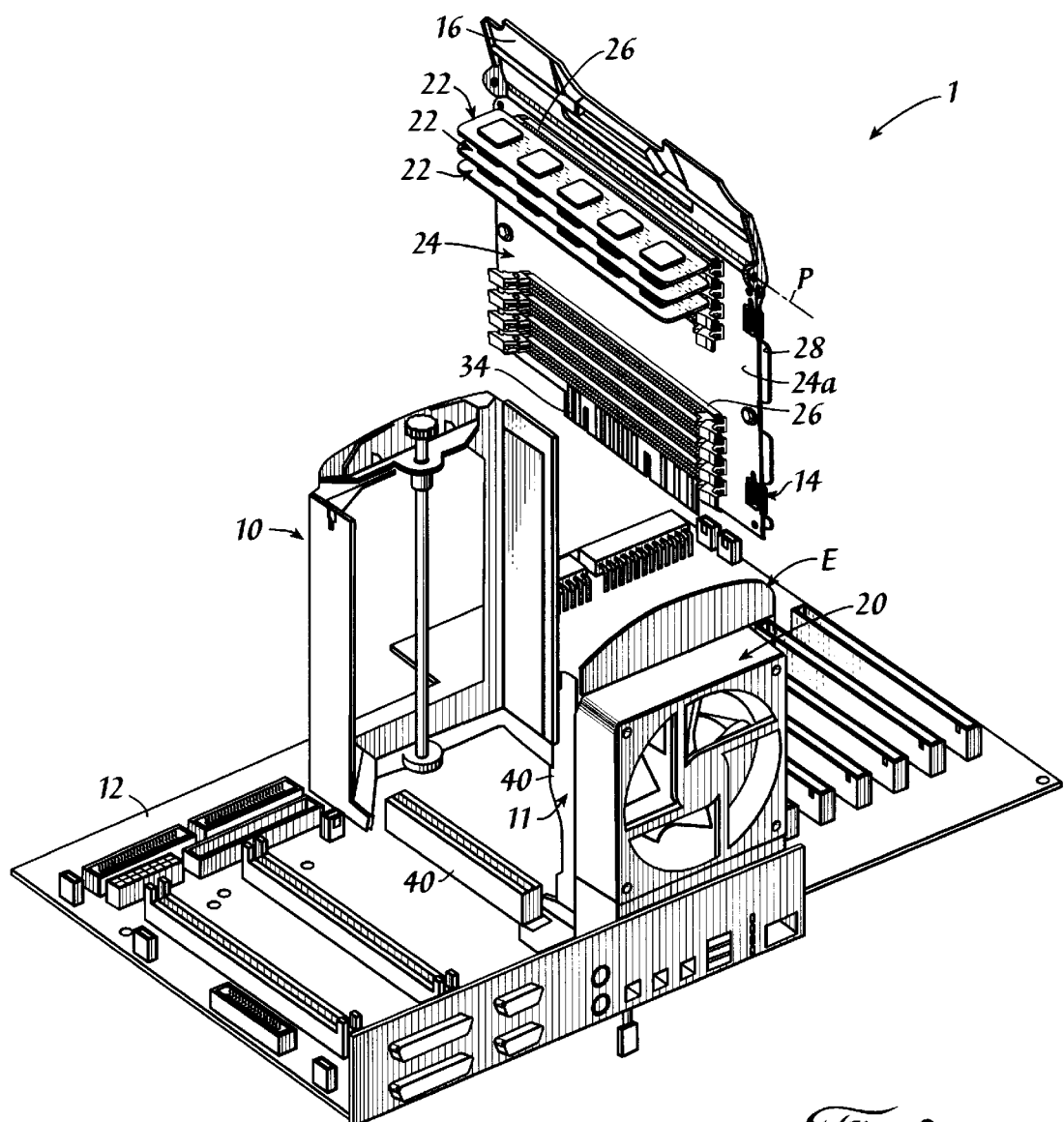
FIG. 2 is a perspective view illustrating the apparatus of FIG. 1 with a plurality of side panel assemblies removed.

An embodiment of an apparatus 1 for cooling a system component of an electronic device and for reducing the magnitude of electromagnetic emissions from the system component is illustrated in FIGS. 1 and 2. The apparatus 1 includes a first end bracket 10 spaced apart from a second end bracket 11. The end brackets 10, 11 are attached to a base substrate 12 such as a motherboard of a computer. Two spaced apart side panel assemblies 14 are removably attached between the end brackets 10, 11.

A shroud member 16 is pivotally attached to each one of the side panel assemblies 14. Each shroud member 16 is movable between an open position O and a closed position C, as illustrated in FIG. 1. When each shroud member 16 is in the closed position C, an air duct 18, FIG. 1, is defined between the base substrate 12, the side panel assemblies 14 and the shrouds 16. The shrouds 16 (when in the closed position C) and the base substrate 12 define opposing side walls of the air duct 18. The end brackets 10, 11 and the shrouds 16 are preferably made of a polymeric material such as Polycarbonate, Acrylonitrile Butadiene Styrene (commonly known as ABS) or a combination thereof using a process such as injection molding.

A plurality of heat generating components 22, FIG. 2, are attached to at least one of the side panel assemblies 14. In one embodiment, the side panel assemblies 14 are system component assemblies including an expansion card or a riser card with at least one heat generating component attached to the expansion card. Heat generating components 22 include system components of an electronic device such as memory modules, microprocessors and video controllers. Each one of the side panel assemblies 14 are oriented between the end brackets 10 and 11 with the heat generating components 22 facing toward the air duct 18. A fan 20 is attached to the second end bracket 11 for directing a stream of air through the air duct 18. In this orientation, the heat generating components 22 are exposed to the stream of air as it passes through the air duct 18 such that the convective transfer of heat from the heat generating components 22 is significantly increased. A key benefit of the shrouds 16 is that each shroud contributes to providing an efficient flow of air through the air duct 18. A key benefit of the fan being attached to the end bracket 11 is reduced acoustical noise associated with the operation of the fan 20. The acoustical noise generated by the fan 20 is reduced by the mechanical attachment of the fan 20 to the end bracket 11 and by the mechanical attachment of the base substrate to an enclosure or chassis of the associated electronic device.

Figure 3:
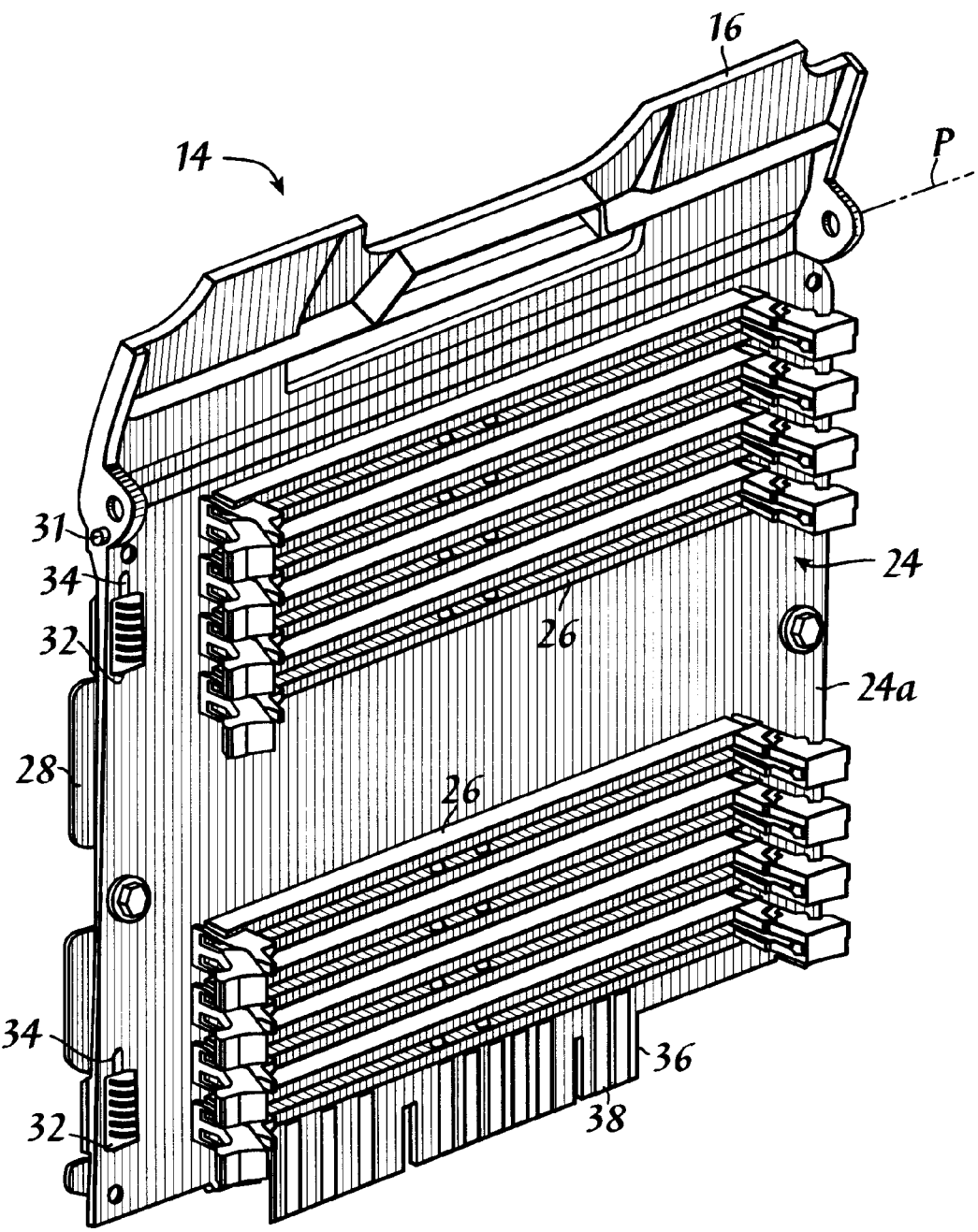
FIG. 3 is a perspective view illustrating an embodiment of a printed circuit substrate portion of the side panel assembly.
Figure 4:
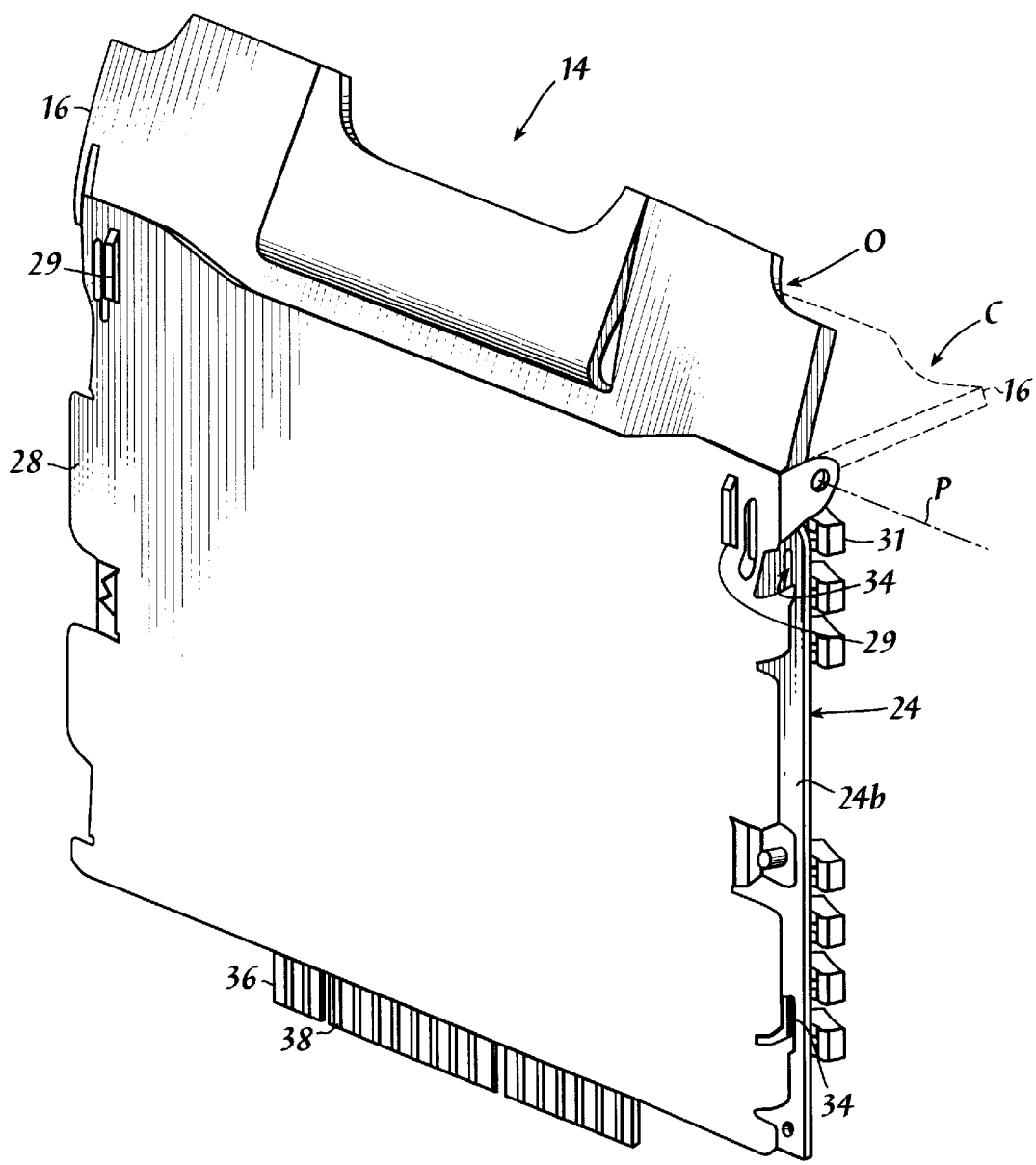
FIG. 4 is a perspective view illustrating an embodiment of a support member portion of the side panel assembly.

Referring now to FIGS. 2–5, the side panel assemblies 14 include a printed circuit substrate 24 having a plurality of connectors 26 attached to the first side 24a, FIGS. 2 and 3, and a support member 28 attached to a second side 24b, FIG. 4. The support member 28 is made of a metallic material such as steel to increase the overall strength of the respective side panel assembly 14. In other embodiments, the support member 28 may be made of a non-conductive material such as a polymeric material. A single size support member 28 can be used with different size printed circuit substrates 24. The support member 28 includes a plurality of alignment members 29. Each one of the end brackets 10, 11 includes an alignment feature, discussed below, that receives a corresponding one of the alignment members 29. The heat generating components 22 are electrically connected to the printed circuit substrate 24 of the corresponding side panel assembly 14.

The shroud 16, FIGS. 3 and 4, is pivotally attached to the support member 28 for being pivoted about a pivot axis P between the open position O and the closed position C, FIG. 4. The shrouds 16 define a shroud assembly extending between the side panel assemblies 14 when both shrouds 16 are in the closed position C. A pivot pin 31 is attached to each end of the shroud 16. Each pivot pin 31 is offset from the pivot axis P such that each pivot pin 31 rotates about the pivot axis P when the shroud 16 is moved between the open position O and closed position C. As discussed below, the pivot pins 31 engage a corresponding portion of the adjacent side panel 10, 11 when the shroud 16 is moved from open position O to the closed position C to positively seat the side panel assembly 14 relative to the base substrate 12.

Figure 5:
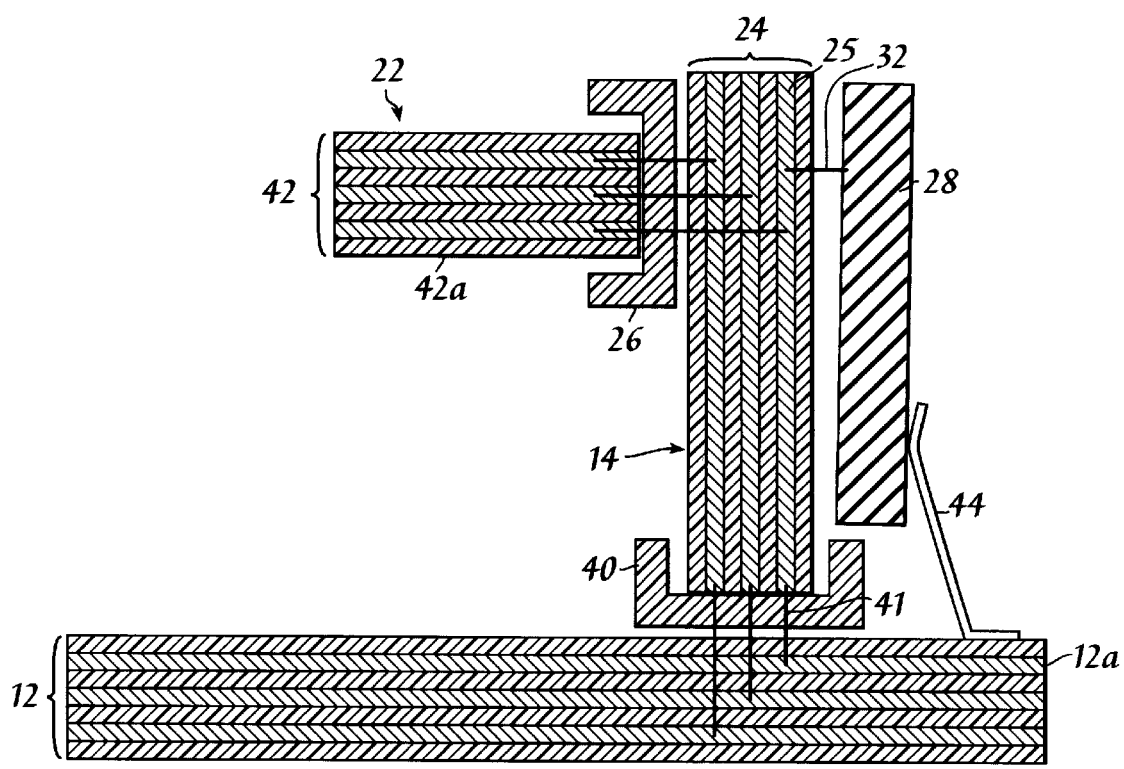
FIG. 5 is a diagrammatic view illustrating an embodiment of the electrical connections between a base substrate, the printed circuit substrate of the side panel assembly and a printed circuit card of a heat generating component.

The printed circuit substrate 24 of the side panel assembly 14 includes at least one reference voltage plane 25, FIG. 5. The support member 28 is electrically connected to the reference voltage plane 25 of the printed circuit substrate 24 by a plurality of clips 32, FIGS. 3 and 5. Each one of the clips 32 are inserted through a corresponding hole 34, FIGS. 3 and 4, in the printed circuit substrate 24. The reference voltage plane 25 is exposed at each hole 34 such that an electrical connection is established between the reference voltage plane 25 and the support member 28.

The printed circuit substrate 24, FIGS. 2–4, also includes an edge portion 36 having a plurality of contacts 38. The contacts 38 are electrically connected to the connectors 26 via conductive traces (not shown) formed on one or more conductive layers of the printed circuit substrate 24. The contacts 38 engage respective terminal (not shown) of a corresponding connector 40, FIG. 2, that is mounted on the base substrate 12. In this manner, electrical continuity is established between the base substrate 12 and heat generating components of the side panel assemblies 14.

As illustrated in FIG. 5, the base substrate 12 includes a reference voltage plane 12a and the heat generating device 22 includes a printed circuit card 42 having a reference voltage plane 42a. A conductive contact member 44 is resiliently mounted to the base substrate 12 adjacent to the connector 26. The conductive contact member 44 is electrically connected to the reference voltage plane 12a of the base substrate 12. When the edge portion 36, FIG. 2, of the side panel assembly 24 is mounted in the connector 40, the conductive contact member 44, FIG. 5, engages the support member 28 to provide electrical continuity between the reference voltage plane 12a of the base substrate 12, the support member 28 and the reference voltage plane 25 of the printed circuit substrate 24. Electrical continuity can also be established between the reference voltage planes 12a and the reference voltage plane 25 through a terminal 41 of the connector 40.

By electrically connecting the support member 28 to the reference voltage planes 12a, 25, 42a of the base substrate 12, the printed circuit substrate 24, and the printed circuit card 42, respectively, a conductive return current path is established for the electrical portion of the electromagnetic emissions. A portion of the electromagnetic emissions couple to the support member 28 and return to their source (the heat generating components). In this manner, the magnitude of the electromagnetic emissions that are emitted from the heat generating components 22 is significantly reduced. It is desirable to reduce the magnitude of the electromagnetic emissions to reduce adverse affects of the electromagnetic emissions (such as electromagnetic interference) on adjacent electronic components and equipment. It is not essential for the reference voltage planes 12a, 25 to be ground planes. They need only be constant voltage planes.

Figure 6A:
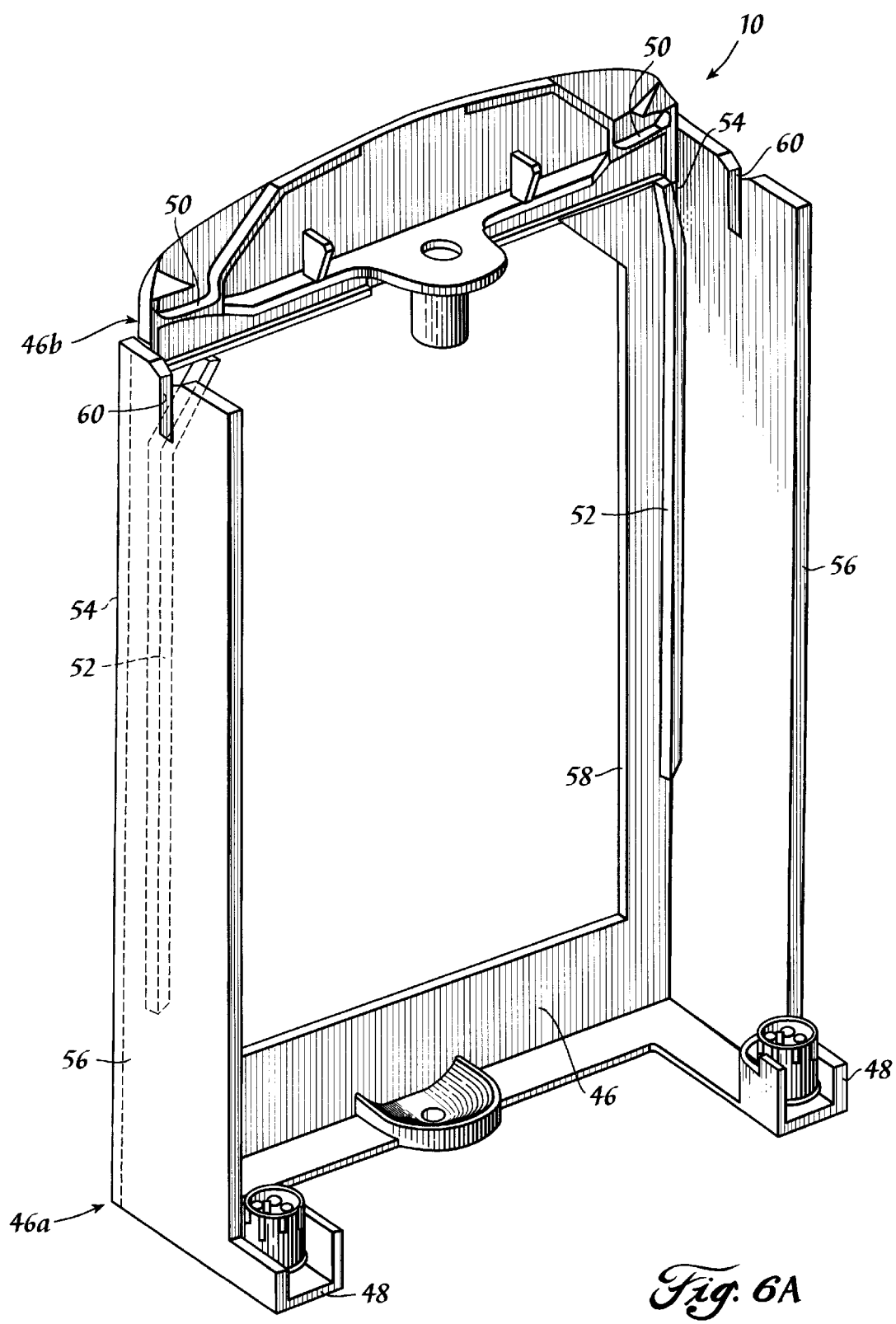
FIG. 6A is a perspective view illustrating an embodiment of an end bracket.
Figure 6B:
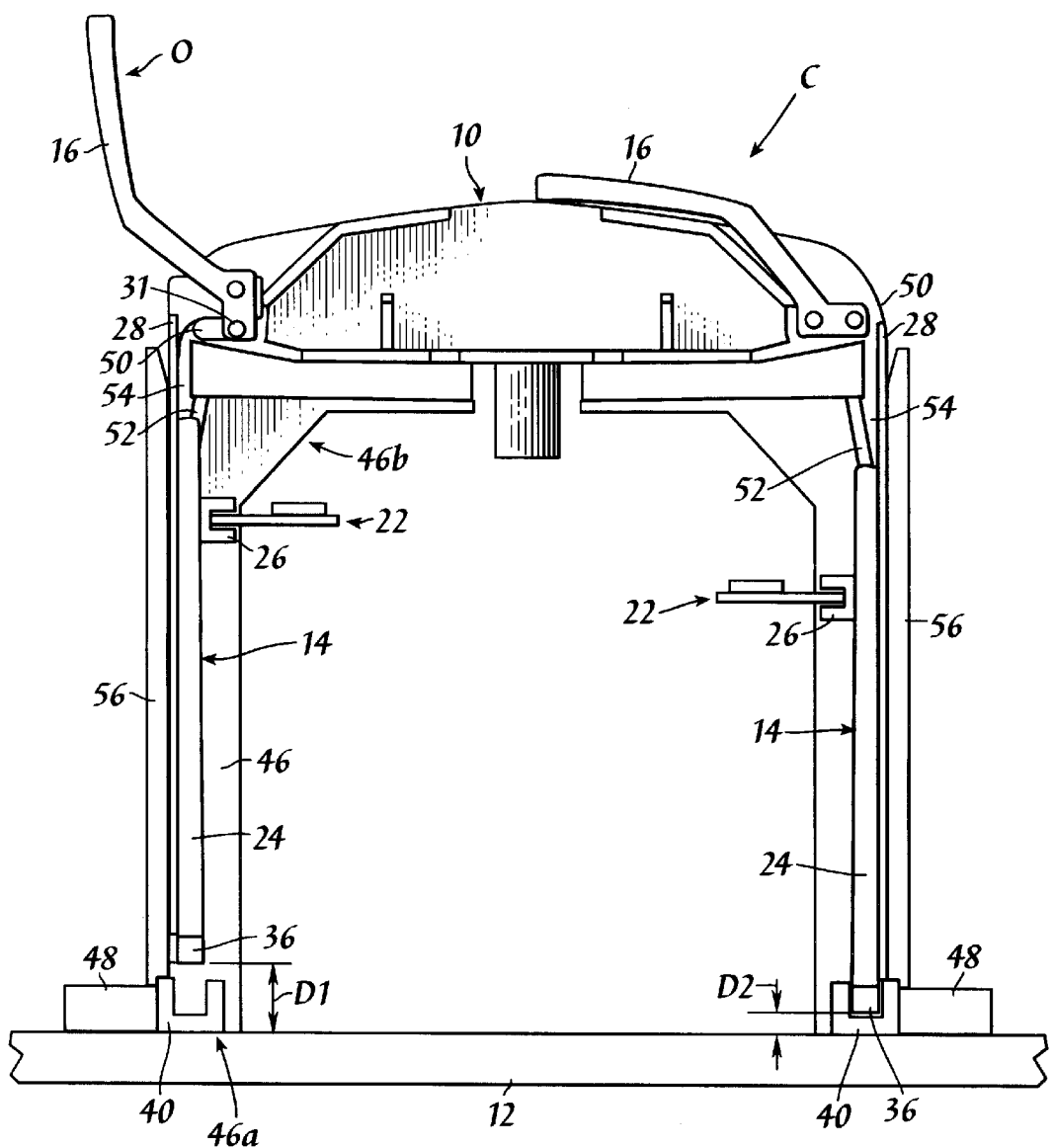
FIG. 6B is a diagrammatic view illustrating a side panel assembly at an inserted depth and side panel assembly at a seated depth with respect to the base substrate.

An embodiment of the first end bracket 10 is illustrated in FIGS. 6A and 6B. The first end bracket 10 includes an end wall 46 and a plurality of mounting members 48 attached adjacent to a first end 46a of the end wall 46. The mounting members 48 are configured for being attached to a base structure such as the base substrate 12 illustrated in FIG. 1. A plurality of shroud engaging portions 50 are attached adjacent to a second end 46b of the end wall 46. A plurality of guide members 52 are attached to the end wall 46. The guide members 52 extend between the first and second ends 46a, 46b of the end wall 46. The first end bracket 10 is defined to be a stationary end bracket in that it is not pivotable with respect to the base substrate 12.

A slot 54, FIG. 6A, for receiving a corresponding one of the side panel assemblies 14 is defined between each guide member 52 and a corresponding side wall 56. A opening 58 is formed through the end wall 46 between two of the guide members 52. A slot 60, is provided in each side wall 56 for receiving the alignment member 29, FIG. 4, of the corresponding side panel assembly 14. As illustrated in FIG. 6B, when the shroud 16 is in the open position 0, the side panel assembly 14 may be inserted to an insertion position D1 with respect to the base substrate 12. When shroud 16 is moved to the closed position C, the pin 31 of each shroud 16 engages the corresponding shroud engaging portion 50 of the first end bracket 10, moving the side panel assembly 14 to a seated position D2 with respect to the base substrate 12 such that the edge portion 36 of the printed circuit substrate 24 engages the corresponding connector 40 of the base substrate 12.

Figure 7:
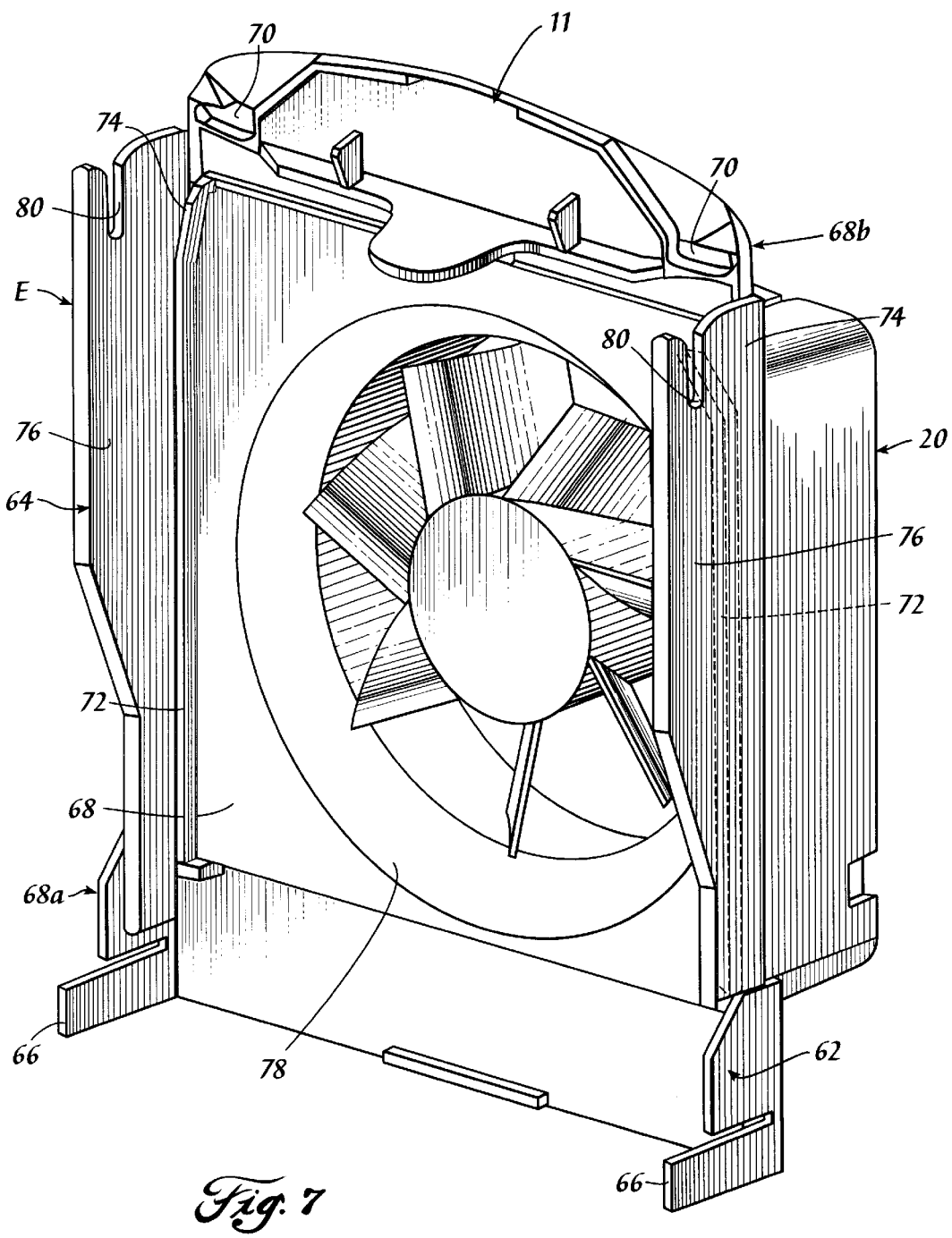
FIG. 7 is a perspective view illustrating another embodiment of an end bracket.
Figure 8:
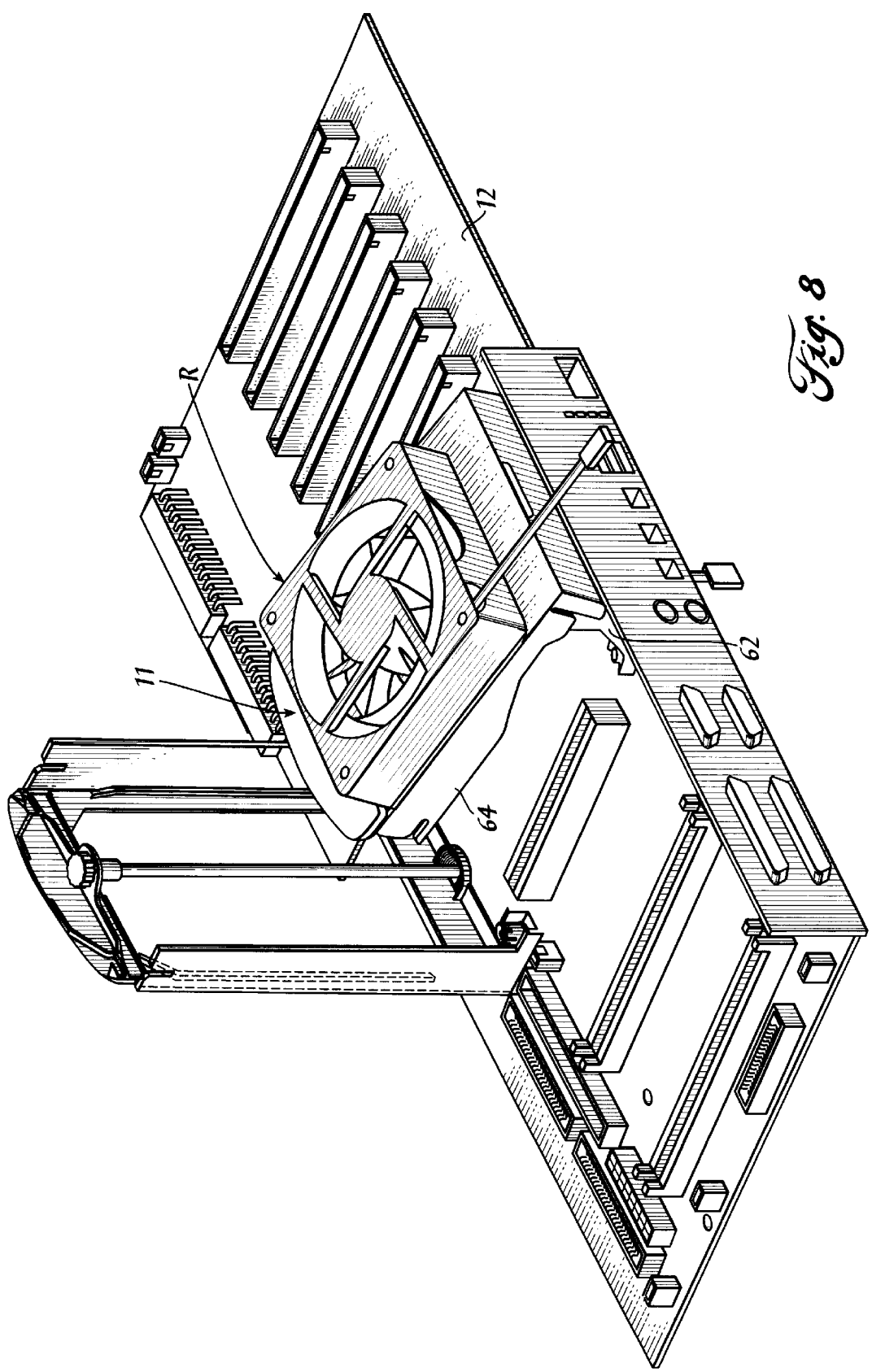
FIG. 8 is a perspective view illustrating the end bracket of FIG. 7 in a retracted position.

An embodiment of the second end bracket 11 is illustrated in FIGS. 7 and 8. The second end bracket 11 includes a base portion 62 and a mounting portion 64. The base portion 62 of the second end bracket 11 includes a plurality of mounting members 66 configured for being attached to a base structure such as the base substrate 12 illustrated in FIG. 8. The mounting portion 64 of the second end bracket 11 is pivotally attached at a first end 68a of an end wall 68 to the base portion 62 for being moved between an extended position E, FIGS. 2 and 7, and a retracted position R, FIG. 8, with respect to the base portion 62. It is desirable for the mounting portion 62 to be movable to the retracted position R to simplify installation of the base substrate 12 into a housing of an electronic apparatus (such as a computer) with second end bracket 11 already attached to the base substrate 12. Furthermore, servicing of components adjacent to the second end bracket 11 is simplified by removing the side panel assemblies 14 and moving the second end bracket 11 to the retracted position R. The second end bracket 11 is defined to be a pivotable end bracket in that it is pivotable with respect to the base substrate 12. Several benefits are associated with the second end bracket 11 being pivotable.

A plurality of shroud engaging portions 70, FIG. 7, are attached adjacent to a second end 68b of the end wall 68. A plurality of guide members 72 are attached to the end wall 68. The guide members 72 extend between the first and second ends 68a, 68b of the end wall 68. A slot 74 for receiving a corresponding one of the side panel assemblies 14 is defined between each guide member 72 and a corresponding side wall 76. A opening 78 is formed through the end wall 68 between two of the guide members 72. The fan 20, discussed above in reference to FIGS. 1 and 2, is attached to the mounting portion 64 adjacent to the opening 78 for directing a stream of air through that opening. A slot 80 is provided in each side wall 76 for receiving the alignment member 29, FIG. 4, of the corresponding side panel assembly 14.

Figure 9:
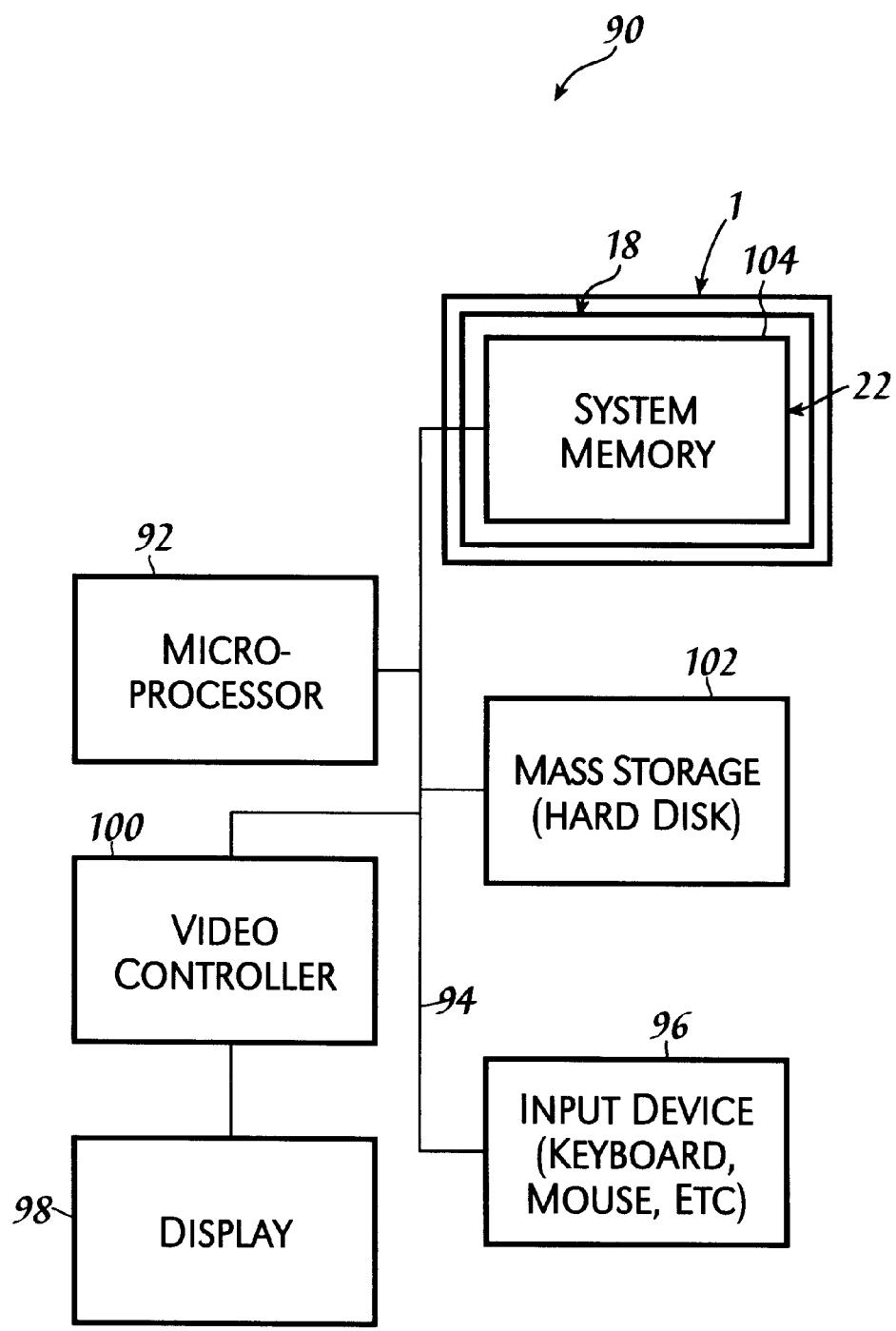
FIG. 9 is a block diagram illustrating an embodiment of a computer system.

An embodiment of a computer system 90 is illustrated in FIG. 9. The computer system 90 includes at least one microprocessor 92. The microprocessor 92 is connected to a signal bus 94. The signal bus 94 serves as a connection between the microprocessor 92 and other components of the computer system 90. One or more input devices 96 may be coupled to the microprocessor 92 to provide input to the microprocessor 92. Examples of input devices include keyboards, touchscreens, and pointing devices such as a mouse, a trackball and a trackpad. The computer system 90 may also include a display 98 which is typically coupled to the microprocessor 92 by a video controller 100. Programs and data are stored on a mass storage device 102 which is coupled to the microprocessor 92. Mass storage devices include components such as hard disks, optical disks, magneto-optical drives, floppy drives, and the like. A system memory 104 is coupled to the microprocessor 92 for providing the microprocessor 92 with fast storage to facilitate execution of computer programs by the microprocessor 92. The system memory 104, which includes the heat generating component 22 of the computer system 90, is mounted within the air duct 18 of the apparatus 1 discussed above in reference to FIG. 1. It should be understood that other busses and intermediate circuits can be employed between the components described above and microprocessor 92 to facilitate interconnection between the components and the microprocessor 92.

One embodiment provides an apparatus for reducing electromagnetic emissions from an electronic device including a base substrate having a reference voltage plane. A plurality of spaced apart printed circuit substrates are attached to the base substrate. Each one of the printed circuit substrates includes a reference voltage plane attached to the reference voltage plane of the base substrate. A system component is removably attached to a first side of a first one of the printed circuit substrates. The system component is electrically connected to the reference voltage plane of the first printed circuit substrate. A support member is attached to a second side of the first printed circuit substrate. The support member is electrically coupled to the reference voltage plane of the first printed circuit substrate.

Another embodiment provides an electronic device enclosure comprising a base, a pair of opposed end brackets and a pair of opposed side panels. Each side panel includes a printed circuit substrate having a reference voltage plane. A system component is attached to a first side of the printed circuit substrate. A support member is attached to a second side of the printed circuit substrate. The support member is electrically coupled to the reference voltage plane. A shroud is pivotally attached to the support member adjacent to a first edge of the printed circuit substrate for being moved between a first position and a second position with respect to the printed circuit substrate. A plurality of electrical contacts are attached to the printed circuit substrate adjacent to a second edge of the printed circuit substrate. At least a portion of the electrical contacts are electrically connected to the system component.

A further embodiment provides a computer system including a base substrate having a reference voltage plane and a microprocessor mounted on the base substrate. An input is coupled to the microprocessor to provide input to the microprocessor and a display is coupled to the microprocessor by a video controller. A mass storage device is coupled to the microprocessor. A plurality of spaced apart printed circuit substrates are attached to the base substrate. Each one of the printed circuit substrates includes a reference voltage plane attached to the reference voltage plane of the base substrate. A memory module is removably attached to a first side of a first one of the printed circuit substrates. The memory module is electrically coupled to the reference voltage plane of the first printed circuit substrate and is coupled to the microprocessor to provide storage to facilitate execution of computer programs by the microprocessor. A support member is attached to a second side of the first printed circuit substrate. The support member is electrically coupled to the reference voltage plane of the first printed circuit substrate.

As it can be seen, the embodiments presented herein provide several advantages. The support members can be electrically connected to a reference voltage plane of the printed circuit substrate to provide a low impedance return current path for the electrical portion of the electromagnetic emissions. Fewer components are required to construct an apparatus according to the present disclosure, reducing the cost and assembly time of the apparatus. Panels of a chassis that are adjacent to the enclosure aid in containing the electromagnetic emissions within the apparatus. Alignment of the side panel assemblies is simplified by the guide members and alignment members. The support members increase the overall strength of the side panel assemblies. A single size support member can be used with different size printed circuit cards.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for reducing electromagnetic emissions from an electronic device, comprising:

a base substrate including a reference voltage plane;

a plurality of spaced apart printed circuit substrates attached to the base substrate, each one of the printed circuit substrates including a reference voltage plane attached to the reference voltage plane of the base substrate;

a system component removably attached to a first side of a first one of the printed circuit substrates, the system component being electrically connected to the reference voltage plane of the first printed circuit substrate; and a support member attached to a second side of the first printed circuit substrate, the support member being electrically coupled to the reference voltage plane of the first printed circuit substrate.

2. The apparatus of claim 1 further comprising a first shroud pivotally attached to the support member of the first printed circuit substrate and a second shroud pivotally attached to the support member of a second printed circuit substrate, the first and second shrouds being movable between an open position and a closed position.

3. The apparatus of claim 1 wherein the support member is electrically connected to the reference voltage plane of the base substrate.

4. The apparatus of claim 1 further comprising a first end bracket including a mounting portion attached to a first end of each printed circuit substrate, and a second end bracket including a mounting portion attached to the second end of each printed circuit substrate.

5. The apparatus of claim 1 wherein the support members and the printed circuit substrates extend generally perpendicular to the base substrate.

6. The apparatus of claim 1 further comprising a plurality of conductive contact members attached to the base substrate, at least one of the conductive contact members being electrically connected between the reference voltage plane of the base substrate and each support member.

7. The apparatus of claim 2 wherein the base substrate, the support members and the shrouds define an air duct therebetween when the shrouds are in the closed position.

8. The apparatus of claim 2 further comprising a first end bracket including a mounting portion attached to a first end of each printed circuit substrate and a second end bracket including a mounting portion attached to a second end of each printed circuit substrate.

9. The apparatus of claim 8 further comprising a shroud engaging portion attached to each end bracket, and a pin attached to each shroud at a position offset from a pivot axis of the respective shroud, each pin engaging a corresponding shroud engaging portion when the respective shroud is moved from the open position to the closed position for moving the respective printed circuit substrate from an inserted position to a seated position.

10. The apparatus of claim 9 further comprising an alignment member attached to each support member, and a slot in each end bracket engaged with the corresponding alignment member when the respective printed circuit substrate is in the seated position.

11. The apparatus of claim 9 wherein each printed circuit substrate includes an edge portion and a plurality of contacts mounted on the edge portion, the contacts being electrically connected to the system component of the respective printed circuit substrate and further comprising an electrical connector attached to the base substrate adjacent to each edge portion, the edge portion being engaged with the corresponding connector when the printed circuit substrate is in the seated position.

12. The apparatus of claim 4 wherein at least one of the end brackets includes a base portion attached to the base substrate, the mounting portion being pivotally attached to the base portion such that the mounting portion is movable between a retracted position and an extended position.

13. The apparatus of claim 4 wherein a fan is attached to at least one of the end brackets.

14. An electronic device enclosure comprising:
a base;
a pair of opposed end brackets mounted on the base; and
a pair of opposed side panels mounted on the base and connected to the end brackets, each side panel comprising:
  a printed circuit substrate including a reference voltage plane;
  a system component attached to a first side of the printed circuit substrate;
  a support member attached to a second side of the printed circuit substrate, the support member being electrically coupled to the reference voltage plane;
  a shroud pivotally attached to the support member adjacent to a first edge of the printed circuit substrate for being moved between a first position and a second position; and
  a plurality of electrical contacts attached to the printed circuit substrate adjacent to a second edge of the printed circuit substrate, at least a portion of the electrical contacts being electrically connected to the system component.

15. The enclosure of claim 14 further comprising a pin attached to the shroud at a position offset from a pivot axis of the shroud.

16. The enclosure of claim 14 further comprising an alignment member attached to the support member.

17. The enclosure of claim 14 wherein the printed circuit substrate includes an edge portion having a plurality of contacts electrically connected to the system component.

18. A computer system, comprising:
a base substrate including a reference voltage plane;
a microprocessor mounted on a base substrate;
an input coupled to the microprocessor to provide input to the microprocessor;
a display coupled to the microprocessor by a video controller;
a mass storage coupled to the microprocessor;
a plurality of spaced apart printed circuit substrates attached to the base substrate, each one of the printed circuit substrates including a reference voltage plane attached to the reference voltage plane of the base substrate;
a memory module removably attached to a first side of a first one of the printed circuit substrates, the memory module being electrically coupled to the reference voltage plane of the first printed circuit substrate and being coupled to the microprocessor to provide storage to facilitate execution of computer programs by the microprocessor; and
a support member attached to a second side of the first printed circuit substrate, the support member electrically coupled to the reference voltage plane of the first printed circuit substrate.

19. The computer system of claim 18 further comprising a first shroud pivotally attached to the support member of the first printed circuit substrate, and a second shroud pivotally attached to the support member of a second printed circuit substrate, the first and second shrouds being movable between an open position and a closed position.

20. The computer system of claim 18 wherein the support member is electrically connected to the reference voltage plane of the base substrate.

21. The computer system of claim 18 further comprising a first end bracket including a mounting portion attached to a first end of each printed circuit substrate, and a second end bracket including a mounting portion attached to the second end of each printed circuit substrate.

22. The computer system of claim 18 wherein the support members and the printed circuit substrates extend generally perpendicular to the base substrate.

23. The computer system of claim 18 further comprising a plurality of conductive contact members attached to the base substrate, at least one of the conductive contact members being electrically connected between the reference voltage plane of the base substrate and each support member.

24. The computer system of claim 19 wherein the base substrate, the shielding members and the shrouds define an air duct therebetween when the shrouds are in the closed position.

25. The computer system of claim 19 further comprising a first end bracket including a mounting portion attached to a first end of each printed circuit substrate, and a second end bracket including a mounting portion attached to the second end of each printed circuit substrate.

26. The computer system of claim 21 wherein at least one of the end brackets includes a base portion attached to the base substrate, the mounting portion being pivotally attached to the base portion such that the mounting portion is movable between a retracted position and an extended position.

27. The computer system of claim 21 wherein a fan is attached to at least one of the end brackets.

28. The computer system of claim 25 further comprising a shroud engaging portion attached to each end bracket, and a pin attached to each shroud at a position offset from a pivot axis of the shroud, each pin engaging a corresponding shroud engaging portion when the respective shroud is moved from the open position to the closed position for moving the respective printed circuit substrate from an inserted position to a seated position.

29. The computer system of claim 28 further comprising an alignment member attached to each support member, and a slot in each end bracket for receiving the corresponding alignment member when the respective printed circuit substrate is in the seated position.

30. The computer system of claim 28 wherein each printed circuit substrate includes an edge portion and a plurality of contacts mounted on the edge portion, the contacts being electrically connected to the system component of the respective printed circuit substrate and further comprising an electrical connector attached to the base substrate adjacent to each edge portion, the edge portion engaging the corresponding connector when the printed circuit substrate is in the seated position.

* * * * *